(12) United States Patent
Wang

(10) Patent No.: US 8,190,841 B2
(45) Date of Patent: May 29, 2012

(54) METHOD OF MANAGING SECTORS OF A NON-VOLATILE MEMORY

(75) Inventor: Hongyu Wang, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 283 days.

(21) Appl. No.: 12/520,864

(22) PCT Filed: Mar. 21, 2007

(86) PCT No.: PCT/CN2007/000911
§ 371 (c)(1),
(2), (4) Date: Feb. 22, 2010

(87) PCT Pub. No.: WO2008/113212
PCT Pub. Date: Sep. 25, 2008

(65) Prior Publication Data
US 2010/0161931 A1    Jun. 24, 2010

(51) Int. Cl.
*G06F 12/00*          (2006.01)
(52) U.S. Cl. ........ 711/165; 711/103; 711/156; 711/202; 711/206; 711/221
(58) Field of Classification Search ................. 711/103, 711/156, 165, 202, 203, 206, 207
See application file for complete search history.

(56) References Cited

U.S. PATENT DOCUMENTS 6,978,342 B1 * 12/2005 Estakhri et al. ............... 711/103
7,610,438 B2 * 10/2009 Lee et al. ...................... 711/103
7,970,985 B2 *  6/2011 Gonzalez et al. ............. 711/103

FOREIGN PATENT DOCUMENTS

| CN | 1900919 A | 1/2007 |
| JP | 2005085445 A | 3/2005 |
| JP | 2005100469 A | 4/2005 |
| WO | WO-2008/113212 A1 | 9/2008 |

OTHER PUBLICATIONS

Shuo Zhu, International Search Report, Patent Cooperation Treaty, Nov. 29, 2007, 4 pages, PCT/CN2007/000911, The State Intellectual Property Office, the P.R. China, Beijing, China.
Shuo Zhu, Written Opinion of the International Searching Authority, Nov. 20, 2007, 3 pages, PCT/CN2007/000911, The State Intellectual Property Office, the P.R. China, Beijing, China.
Ellen Moyse, International Preliminary Report on Patentability, Sep. 22, 2009, 4 pages, PCT/CN2007/000911, The State Intellectual Property Office, the P.R. China, Beijing, China.
First Office Action for Chinese Patent Application No. 200780052236.8, Mailed Oct. 13, 2010, 7 pages.

* cited by examiner

*Primary Examiner* — John Lane
(74) *Attorney, Agent, or Firm* — Blakely, Sokoloff, Taylor & Zafman LLP

(57) ABSTRACT

Machine-readable media, methods, apparatus and system for managing sectors of a non-volatile memory are described. In some embodiments, a plurality of file segments may be written to a plurality of memory sectors (501), each memory sector of the plurality of memory sectors for each file segment of the plurality of file segments. Then, a plurality of flags may be searched from a first section of a sector table (502), each flag of the plurality of flags corresponding to the each file segment. A section may be selected from a second section and a third section of the sector table, wherein the section may be indicated by the plurality of flags (505,507). A plurality of physical addresses for the plurality of memory sectors may be written to the section (506,508).

14 Claims, 4 Drawing Sheets

METHOD OF MANAGING SECTORS OF A NON-VOLATILE MEMORY

CROSS REFERENCE TO RELATED APPLICATION

This patent application is a U.S. National Phase application under 35 U.S.C. §371 of International Application No. PCT/CN2007/000911, filed on Mar. 21, 2007, entitled METHOD OF MANAGING SECTORS OF A NON-VOLATILE MEMORY.

BACKGROUND

A non-volatile memory may comprise a plurality of memory blocks, while each block may comprise a plurality of sectors. Normally, segments of a file may each be stored into physically separate sectors of the non-volatile memory. A sector table may be used to store physical addresses of the sectors. Each entry of the sector table may correspond to each segment of the file and comprise a plurality of sub-entries. First sub-entry may contain a physical location of an initial sector storing a file segment. Subsequent sub-entries may contain physical addresses of subsequent sectors storing the file segment, if the file segment is replaced from the first sector to a subsequent sector, and then is replaced from the subsequent sector to another subsequent sector and so on.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

The following description describes techniques for a method of managing sectors of a non-volatile memory. In the following description, numerous specific details such as logic implementations, pseudo-code, methods to specify operands, resource partitioning/sharing/duplication implementations, types and interrelationships of system components, and logic partitioning/integration choices are set forth in order to provide a more thorough understanding of the present invention. However, the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; and others.

Figure 1:
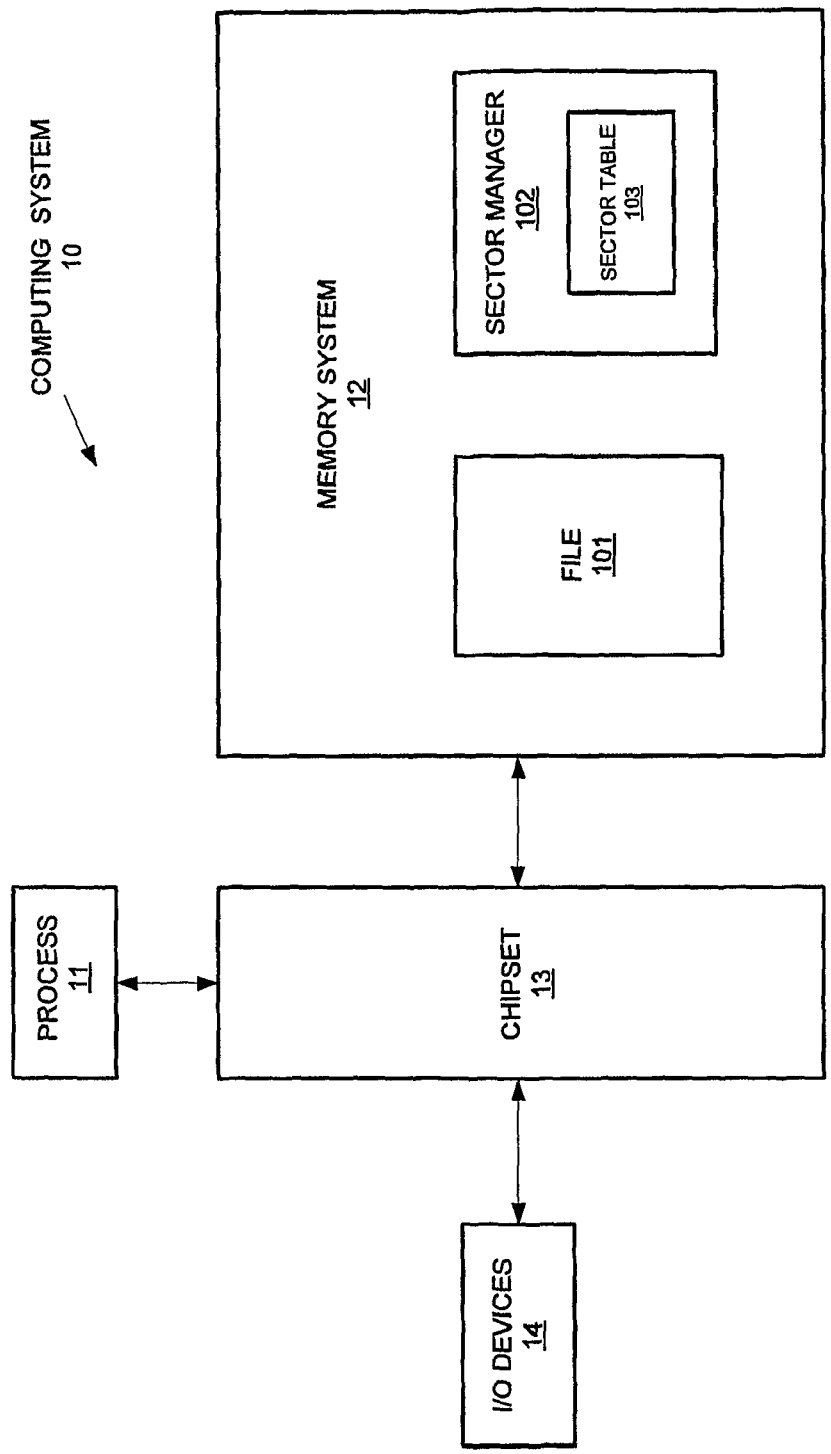
FIG. 1 illustrates a computing platform storing a file in a plurality of memory sectors.

FIG. 1 shows an embodiment of a computing system. As shown, the computing system 10 may comprise one or more processor 11, memory system 12, chipset 13, I/O devices 14, and possibly other components. Examples for the computing system 10 may comprise a cell phone, a digital camera, a computer and other devices for processing and storing data.

One or more processors 11 may be communicatively coupled to various components (e.g., the chipset 13) via one or more buses such as a processor bus. Processors 11 may be implemented as an integrated circuit (IC) with one or more processing cores that may execute codes under a suitable architecture, for example, including Intel® Pentium™, Intel® Itanium™, Intel® Core™ Duo architectures, available from Intel Corporation of Santa Clara, Calif.

Memory system 12 may comprise one or more memory devices (not shown) that may be or may not be of the same type. For example, some of the memory devices may be non-volatile memory devices, while some others may be volatile memory devices. Examples of the non-volatile memory devices may comprise Phase Change Memory (PCM).

Phase Change Memory may be a new semiconductor technology, which may use a reversible structural phase-change from an amorphous phase to a crystalline phase in a thin-film material as the data storage mechanism. PCM technology may use a conventional CMOS process with the addition of a few additional layers to form the thin-film memory element. Important features of the PCM technology may include: 1) PCM may allow change of a bit value from 0 to 1 or from 1 to 0; 2) a ECC (error correction code) value is assigned to a memory section with a certain physical span (e.g., ECC value is assigned to each memory section with 1K bits span).

Memory system 12 may store instructions and data as a file 101 and a sector manager 102. File 101 may comprise a plurality of file segments that may each be stored on separate sectors of the memory system. For example, different file segments may be stored in different memory blocks or even different memory sectors within one memory block.

Sector manager 102 may manage the memory sectors storing the file segments through sector table 103. Sector table 103 may record physical address for each sector storing a file segment.

Chipset 13 may provide one or more communicative paths among one or more processors 11, memory 12 and other components, such as I/O devices 14. I/O devices 14 may input or output data to or from computing system 10. Examples for I/O devices 14 may comprise a network card, a blue-tooth, an antenna, and possibly other devices for transceiving data.

Figures 2, 4:
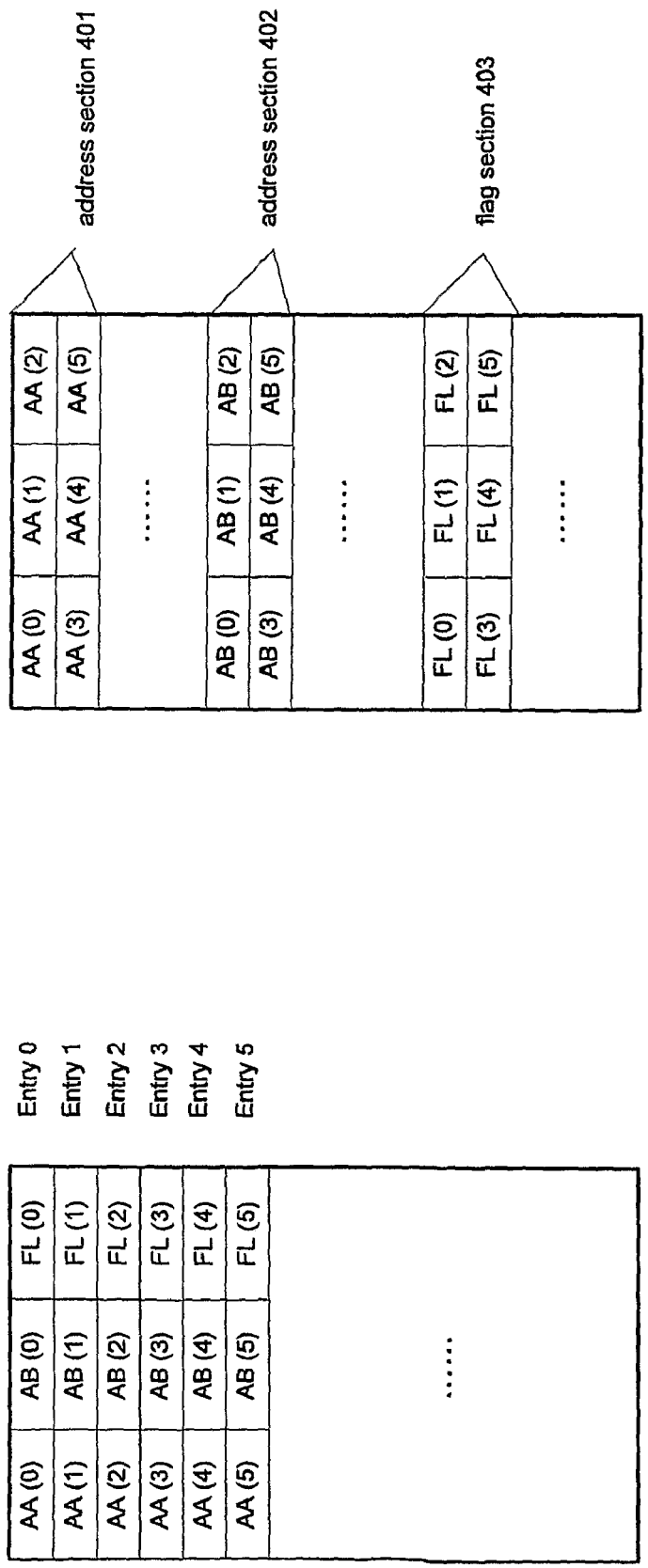
FIG. 2 illustrates an embodiment of a sector table used to managing the memory sectors storing the file.
FIG. 4 illustrates another embodiment of the sector table.

FIG. 2 shows an embodiment of sector table 103. As shown, sector table 103 may comprise a plurality of entries, each entry for each file segment. Each entry may comprise three sub-entries. Each of the first sub-entry (AA) and the second sub-entry (AB) may store a physical address of a sector. The third sub-entry (FL) may store a flag indicating which of the first and second sub-entries stores the physical address of the sector that validly stores the file segment. The flag may take various forms. For example, the flag may comprise a binary bit with bit value "0" or "1". Value "0" may represent the first sub-entry (AA) and value "1" may represent the second sub-entry (AB), or vice versa.

Other embodiments may implement other technologies for sector table 103. For example, the sector table entry may comprise more than two sub-entries to store physical addresses of sectors. In that case, the flag of the entry may comprise two or more bits, whose value may indicate which of the sub-entries contains the physical address of the sector validly storing the file segment.

Figure 3:
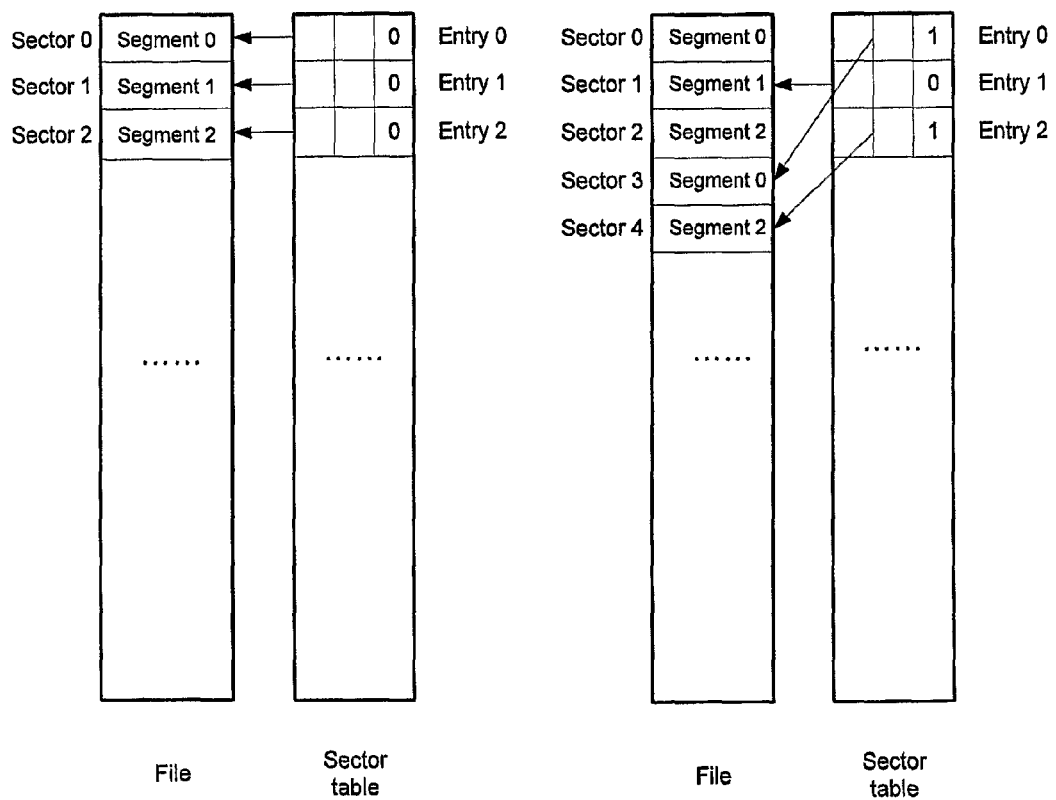
FIG. 3 illustrates how the sector table works if a segment of the file is replaced from a memory sector to another memory sector.

FIG. 3 illustrates how the sector table works if a segment of the file is replaced from a memory sector to another memory sector. Left part of FIG. 3 shows corresponding relationship between file segments stored in memory sectors and entries of sector table 103. Right part of FIG. 3 shows the process of replacing a file segment with the use of sector table 103.

As shown in the left part of FIG. 3, a plurality of file segments (e.g., file segment 0, 1 and 2) may be each stored in a plurality of memory sectors (e.g., sectors with logical numbers 0, 1 and 2). A plurality of entries of sector table 103 may be assigned for the plurality of file segments, each entry for each file segment. Each entry may comprise three sub-entries as described with reference to FIG. 2. One of the three entries may comprise a flag indicating which of the other two sub-entries may contain the physical address of the sector validly storing the corresponding file segment.

For example, entry 0 may correspond to file segment 0. Entry 0 may comprise a first sub-entry to store the physical address of sector 0 which may validly store file segment 0. Entry 0 may further comprise a third sub-entry to store the flag (e.g., a binary bit) whose value (value "0" or value "1") may indicate that the physical address of sector 0 is currently stored in the first sub-entry.

As shown in right part of FIG. 3, in order to replace file segment 0 while ensuring power loss recovery (PLR) of the data, a new sector (e.g., a sector with logical number 3) may be assigned to store file segment 0 before reclaiming sector 0. In that case, the physical address of sector 3 may be stored in the second sub-entry of entry 0 and the flag value may be changed from 0 to 1 (or from 1 to 0 if value "1" represents the first sub-entry and value "0" represents the second sub-entry) to indicate that the second sub-entry stores the physical address of the sector validly storing file segment 0. Then, sector 0 may be reclaimed while ensuring PLR of the data.

The same scenario may be applied if replacing file segment 2. For simplicity, the process of replacing file segment 2 will not be described herein.

FIG. 4 illustrates another embodiment of sector table 103. As shown, sector table 103 may comprise three section: address section 401, that may comprise a plurality of Address A (AA) entries, each AA entry corresponding to a file segment, e.g., AA (0) entry corresponding to file segment 0; address section 402, that may comprise a plurality of Address B (AB) entries, each AB entry corresponding to a file segment, e.g., AB (0) entry corresponding to file segment 0; flag section 403, that may comprise a plurality of flag (FL) entries, each FL entry corresponding to a file segment, e.g., FL(0) entry corresponding to file segment 0.

AA entry of address section 401 or AB entry of address section 402 may contain the physical address of the sector validly storing the corresponding file segment. FL entry of the flag section 403 may store a flag indicating which of address section 401 and address section 402 stores the physical address of the valid sector. The flag may take various forms. For example, the flag may comprise a binary bit with values "0" and "1". Value "0" may represent address section 401 and value "1" may represent address section 402, or vice versa.

For example, if sector 0 validly stores file segment 0 and value of flag (0) is "0", then AA (0) of address section 401 may store the physical address of sector 0. However, if file segment 0 is replaced from sector 0 to sector 3 before reclaiming sector 0, then AB (0) of address section 402 may store the physical address of sector 3 and the value of flag (0) may be changed from "0" to "1" to indicate that address section 402 contains the physical address of sector 3 validly storing file segment 0.

Other embodiments may implement other technologies for sector table 103 as shown in FIG. 4. For example, the sector table may comprise more than two sections to store physical addresses of sectors. In that case, the flag may comprise two or more bits, whose value may indicate which of the sections contains the physical address of the sector validly storing the file segment.

Figure 5:
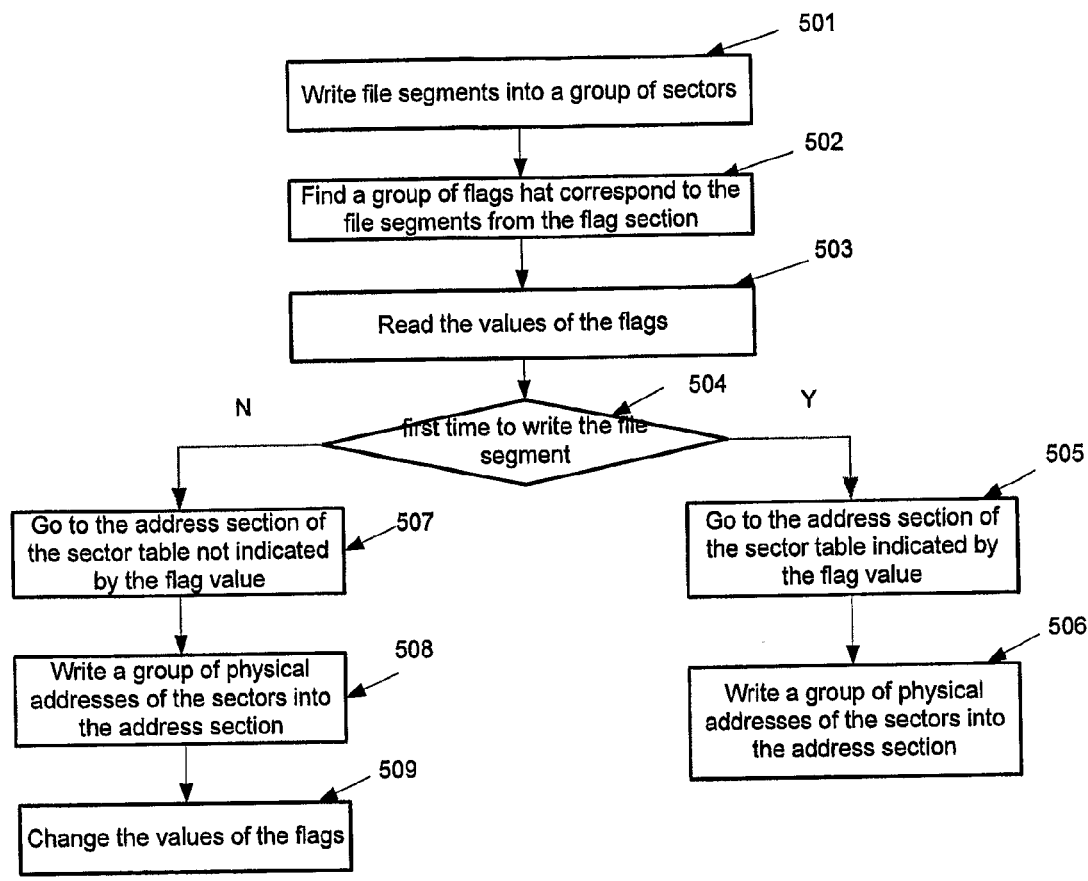
FIG. 5 illustrates an embodiment of a method of writing file segments into the memory sectors.

FIG. 5 illustrates an embodiment of a method of writing file segments into the sectors of the non-volatile memory. In block 501, a group of file segments may be written into a group of memory sectors, each file segment to each memory sector. In block 502, a group of flags corresponding to the group of file segments may be found from flag section 403 of sector table 103. For example, flags (0)-(5) corresponding to file segments (0)-(5) may be found.

In block 503, values of the flags may be read, in which the flag values may be identical with each other, e.g., all "0" or all "1". Then, in block 504, it is determined if it is the first time to write the file segments into the non-volatile memory. If so, the address section of sector table 103 indicated by the flag values may be determined in block 505, and the physical addresses of the sectors may be written to the entries of the address section in block 506. Each entry may correspond to each file segment. For example, given the assumption that value "0" represents address section 401 and value "1" represents address section 402, the physical addresses of the sectors validly storing file segments (0)-(5) may be written to entries (0)-(5) of address section 401 if the flag values are all "0", or be written to entries (0)-(5) of address section 402 if the flag values are all "1".

If it is not the first time to write the file segments to the non-volatile memory (for example, replace the file segments from old sectors to new sectors before reclaiming the old sectors), then the address section of sector table 103 not indicated by the flag values may be determined in block 507, and the physical addresses of the sectors may be written to the entries of the address section in block 508. Each entry may correspond to each file segment. For example, given the assumption that value "0" represents address section 401 and value "1" represents address section 402, the physical addresses of the sectors validly storing file segments (0)-(5) may be written to entries (0)-(5) of address section 402 if the flag values are all "0", or to entries (0)-(5) of address section 401 if the flag values are all "1".

Then, in block 509, the flag values may be changed to indicate the address section storing the valid physical addresses. For example, the flag values may be changed from "0" to "1" if address section 402 stores the valid physical addresses or from "1" to "0" if address section 401 stores the valid physical addresses.

Other embodiments may implement other technologies for the writing method. For example, the above-described writing method may be applied if a single file segment is written to the non-volatile memory.

Figure 6:
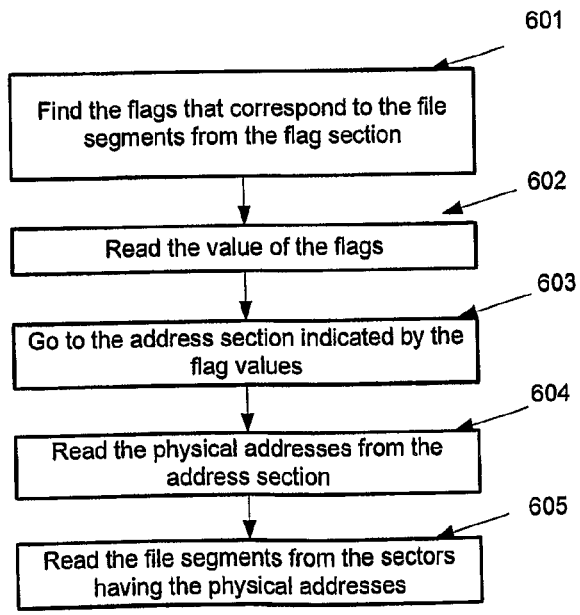
FIG. 6 illustrates an embodiment of a method of reading the file segments from the memory sectors.

FIG. 6 illustrates an embodiment of a method of reading the file segments from the memory sectors. In block 601, the flags corresponding to the file segments are found from flag section 403 of sector table 103. For example, flags (0)-(5) corresponding to file segments (0)-(5) are found. In block 602, values of the flags may be read, in which the flag values may be identical with each other, e.g., all "0" or all "1". In block 603, the address section indicated by the flag values may be determined. For example, given the assumption that value "0" represents address section 401 and value "1" represents address section 402, address section 401 may be determined if the flag values are all "0" or address section 402 may be determined if the flag values are all "1".

In block 604, the valid physical addresses may be read from entries of the address section determined in block 603, in which each of the entries may correspond to each of the file segments. For example, the physical addresses may be read from entries (0)-(5) of the address section. Then, in block 605, the file segments may be read from the sectors having the physical addresses read in block 604.

With sector table 103 as shown in FIG. 4, multiple physical addresses may be written to or read from sector table 103 in one read or write command; multiple flags may be updated in one program command; and ECC value assigned to each section of sector table 103 may be less frequently updated. All of the above may significantly improve read/write performance of PCM and avoid PCM over worn.

Although the present invention has been described in conjunction with certain embodiments, it shall be understood that modifications and variations may be resorted to without departing from the spirit and scope of the invention as those skilled in the art readily understand. Such modifications and variations are considered to be within the scope of the invention and the appended claims.

What is claimed is:

1. An apparatus, comprising:
a plurality of memory sectors to store a plurality of file segments; and
a sector manager to manage the plurality of memory sectors, the sector manager having a sector table that comprises a first section, a second section and a third section, wherein the first section stores a plurality of flags, a flag of the plurality of flags corresponding to a file segment of the plurality of file segments and indicating which of the second section and the third section stores a physical address of a memory sector of the plurality of memory sectors, wherein the memory sector validly stores the file segment.

2. The apparatus of claim 1, wherein if the file segment is initially written to the memory sector, the sector manager stores the physical address of the memory sector into one of the second section and the third section indicated by the flag.

3. The apparatus of claim 2, wherein the one of the second section and the third section, which is indicated by the flag, stores the physical address of the memory sector at a position corresponding to the file segment.

4. The apparatus of claim 1, wherein if the file segment is replaced to the memory sector from another memory sector of the plurality of memory sectors, then the sector manager stores the physical address of the memory sector into one of the second section and the third section not indicated by the flag, and update the flag to indicate the one of the second section and the third section that stores the physical address of the memory sector.

5. The apparatus of claim 4, wherein the one of the second section and the third section, which is not indicated by the flag, stores the physical address of the memory sector at a position corresponding to the file segment.

6. The apparatus of claim 1, wherein the sector manager reads the physical address of the memory sector from one of the first section and the second section indicated by the flag, so that the file segment is read from the memory sector having the physical address.

7. The machine-readable medium of claim 6, wherein the plurality of instructions further result in the system:
replacing a file segment of the plurality of file segments from a memory sector to another memory sector;
searching for a flag from the plurality of flags that corresponds to the file segment;
selecting another section from the second section and the third section, wherein the another section is not indicated by the flag;
writing another physical address of the another memory sector to the another section; and
updating the flag to indicate the another section.

8. The machine-readable medium of claim 7, wherein the another physical address is written to a position in the another section that corresponds to the file segment.

9. The apparatus of claim 1, wherein the memory sectors are phase change memory sectors.

10. A machine-readable non-transitory storage medium comprising a plurality of instructions which when executed result in a system:
writing a plurality of file segments to a plurality of memory sectors, each memory sector of the plurality of memory sectors for each file segment of the plurality of file segments;
searching for a plurality of flags from a first section of a sector table, each flag of the plurality of flags corresponding to the each file segment;
selecting a section from a second section and a third section of the sector table, wherein the section is indicated by the plurality of flags; and
writing a plurality of physical addresses for the plurality of memory sectors to the section.

11. The machine-readable medium of claim 10, wherein the plurality of physical addresses are written to a plurality of positions in the section that correspond to the plurality of file segments.

12. The machine-readable medium of claim 10, wherein the plurality of instructions further result in the system:
searching for the plurality of flags that correspond to the plurality of file segments from the first section of the sector table;
selecting the section from the second section and the third section of the sector table, wherein the section is indicated by the plurality of flags;

reading the plurality of physical addresses for the plurality of memory sectors from the section; and reading the plurality of file segments from the plurality of memory sectors having the plurality of physical addresses.

13. The machine readable medium of claim 10, wherein the plurality of instructions that result in the system reading the plurality of physical addresses, further result in the system:

reading the plurality of physical addresses from a plurality of positions of the section that correspond to the plurality of file segments.

14. The machine-readable medium of claim 10, wherein the memory sectors are phase change memory sectors.

* * * * *